United States Patent
Chen et al.

(10) Patent No.: US 12,477,678 B2
(45) Date of Patent: Nov. 18, 2025

(54) PROCESSOR BACK-PLATE DEVICES

(71) Applicant: Hewlett-Packard Development Company, L.P., Spring, TX (US)

(72) Inventors: Fu-Yi Chen, Taipei (TW); Jui-Ming Chien, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 200 days.

(21) Appl. No.: 18/262,152

(22) PCT Filed: Jan. 29, 2021

(86) PCT No.: PCT/US2021/015767
§ 371 (c)(1),
(2) Date: Jul. 19, 2023

(87) PCT Pub. No.: WO2022/164446
PCT Pub. Date: Aug. 4, 2022

(65) Prior Publication Data
US 2024/0081014 A1  Mar. 7, 2024

(51) Int. Cl.
H05K 7/14 (2006.01)
H05K 7/20 (2006.01)

(52) U.S. Cl.
CPC ......... H05K 7/1402 (2013.01); H05K 7/2039 (2013.01)

(58) Field of Classification Search
CPC ................ H05K 7/1402; H05K 7/2039
USPC ................................. 361/801, 803
See application file for complete search history.

(56) References Cited

U.S. PATENT DOCUMENTS

| | | | |
|---|---|---|---|
| 5,285,350 A | | 2/1994 | Villaume |
| 5,495,389 A | | 2/1996 | Dewitt et al. |
| 6,082,443 A | * | 7/2000 | Yamamoto ............ F28D 15/046 174/15.2 |
| 6,480,388 B1 | * | 11/2002 | Lee ........................ H05K 3/301 257/E23.101 |
| 6,636,424 B2 | | 10/2003 | Lee et al. |
| 7,193,851 B2 | | 3/2007 | Yatskov |
| 7,988,459 B2 | | 8/2011 | Ulen et al. |
| 8,349,564 B2 | | 1/2013 | Macioszek et al. |
| 8,498,117 B2 | | 7/2013 | Andric et al. |
| 9,538,633 B2 | | 1/2017 | Clay |
| 2005/0068740 A1 | * | 3/2005 | Ulen .................. H01L 23/4006 257/E23.087 |
| 2008/0117593 A1 | * | 5/2008 | Andric ................. H01L 23/467 257/E23.099 |

(Continued)

FOREIGN PATENT DOCUMENTS

| | | |
|---|---|---|
| DE | 69419862 T2 | 2/2000 |
| DE | 69331135 T2 | 8/2002 |

(Continued)

*Primary Examiner* — Hung S. Bui
(74) *Attorney, Agent, or Firm* — Quarles & Brady LLP

(57) ABSTRACT

In some examples, a device can include a locking mechanism to couple the device to a computing device enclosure, a first portion at a first level to interact with a processor back-plate, and a second portion at a second level to interact with an area proximate to the processor back-plate, wherein the second portion protrudes to the second level toward the processor back-plate when the device is coupled to the computing device enclosure.

18 Claims, 4 Drawing Sheets

(56) References Cited

U.S. PATENT DOCUMENTS

2008/0290502 A1* 11/2008 Kutlu ...................... H01L 23/42
                                                                257/E23.101
2012/0162923 A1*  6/2012 Lee ..................... H01L 23/4006
                                                                    174/250

FOREIGN PATENT DOCUMENTS

EP          0606111 A2    7/1994
RU           159624 U1    2/2016

* cited by examiner

PROCESSOR BACK-PLATE DEVICES

BACKGROUND

A computing device can allow a user to utilize computing device operations for work, education, gaming, multimedia, and/or other uses. Computing devices can include enclosures to protect computing components such as processors, voltage regulators, fans, heat sinks, among other components. The enclosure can also include brackets for mounting the computing components within the computing enclosure.

DETAILED DESCRIPTION

Figure 1:
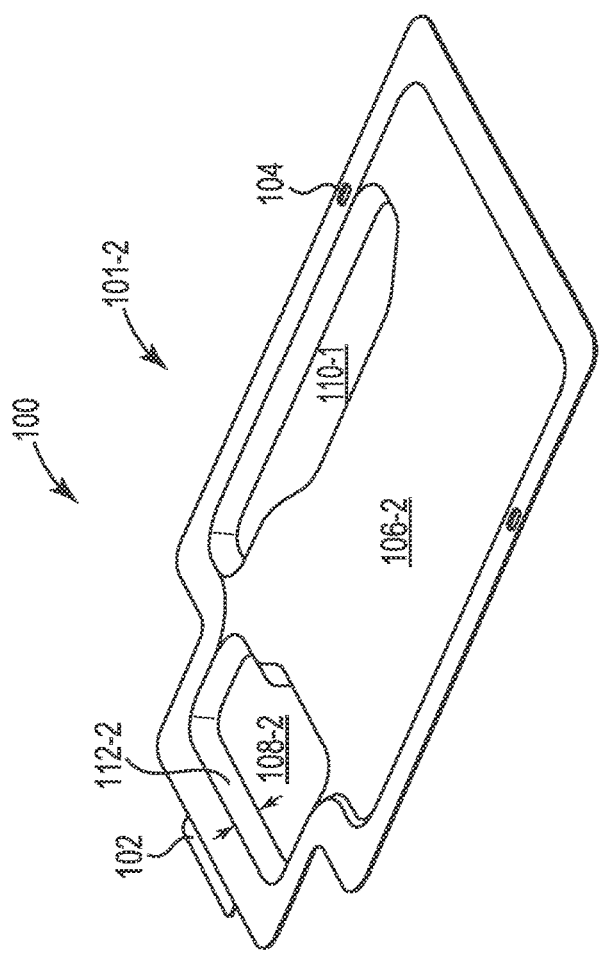
FIG. 1 illustrates an example of a device for a processor back-plate.
Figure 1:
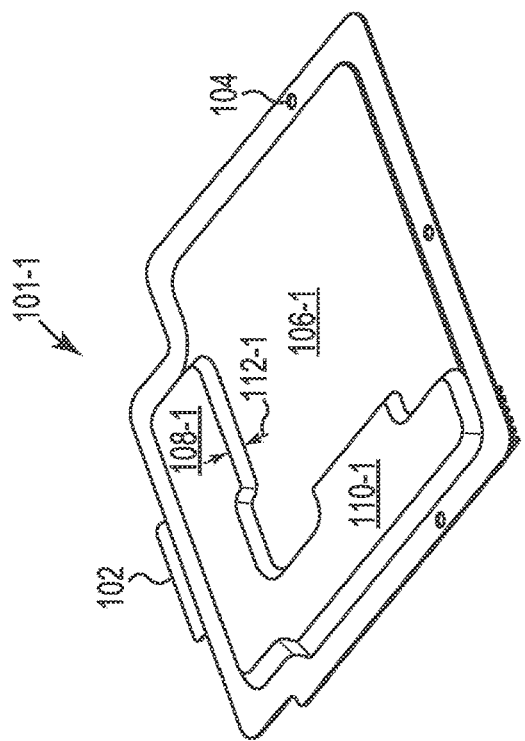

A user may utilize a computing device for various purposes, such as for business and/or recreational use. As used herein, the term computing device refers to an electronic system having a processor resource and a memory resource. Examples of computing devices can include, for instance, a laptop computer, a notebook computer, a desktop computer, an all-in-one (AIO) computer, networking device (e.g., router, switch, etc.), and/or a mobile device (e.g., a smart phone, tablet, personal digital assistant, smart glasses, a wrist-worn device, etc.), among other types of computing devices. The examples here focus on desktop computing devices that include enclosures that can be utilized to enclose or protect computing components such as a processor resource (e.g., processor, central processing unit (CPU), etc.) and/or memory resource.

A computing device enclosure can include brackets that can be utilized to provide a physical connection between computing components and the computing device enclosure. As used herein, a bracket can include a structural element within a computing device enclosure. In some examples, the brackets can position different components at particular locations within the enclosure for heat dissipation, access to electrical connections, and/or interior space restrictions. In some examples, the computing device enclosure can include a bracket that can be utilized to couple an electrical circuit such as a printed circuit, printed circuit board (PCB), printed circuit assembly (PCA), or other type of electrical structure. For example, the computing device enclosure can include a bracket for coupling and securing a computing device motherboard to an interior location of the computing device enclosure.

In some examples, the computing device enclosure can include an aperture within a bracket or portion of the computing device enclosure that is utilized to couple an electrical circuit that includes a processor. In these examples, the aperture can be positioned on an opposite side of the electrical circuit that is utilized to couple the processor. For example, the electrical circuit can be a PCB that includes a first side that is used to couple the processor and a second side is positioned toward the bracket. In this example, the aperture of the bracket can expose the second side or a portion of the second side of the PCB through the bracket. In this way, access can be provided to the second side of the PCB. In some examples, the portion of the second side of the PCB can include an area that is opposite to the location that is used to couple the processor to the PCB.

In some examples, the second side of the electrical circuit can be utilized to couple processor cooling devices that can be utilized to remove heat generated by the processor away from a bottom side of the processor. For example, a cooling device such as a processor back-plate can be coupled to the second side of the electrical circuit to remove heat through the electrical circuit and away from the processor. In some examples, the processor back-plate can be a thermal device to remove heat from a processor positioned on an opposite side of an electrical circuit such as a printed circuit. In some examples, the aperture of the bracket can be utilized to provide access to the second side of the electrical circuit such that the processor and/or the cooling device coupled to the second side of the electrical circuit can be removed, replaced, and/or updated. In some examples, a device, such as a cover can be coupled to an enclosure bracket to cover the aperture to protect the second side of the electrical circuit and/or cooling device coupled to the second side of the electrical circuit.

The present disclosure relates to processor back-plate devices that can be coupled to an enclosure bracket or structure of a computing device enclosure to promote cooling of computing components through an electrical circuit. In some examples, the processor back-plate devices described herein can be brackets, plates, and/or covers that can be coupled to the enclosure bracket of the computing device enclosure to cover the aperture of the enclosure bracket that provides access to the electrical circuit. In some examples, a device can include a locking mechanism to couple the device to a computing device enclosure, a first portion at a first level to interact with a processor back-plate, and a second portion at a second level to interact with an area proximate to the processor back-plate. In these examples, the second portion can protrude to the second level toward the processor back-plate when the device is coupled to the computing device enclosure.

In some examples, the present disclosure can include a bracket that includes a locking mechanism to couple and decouple the bracket to a computing device enclosure. In these examples, the bracket can cover an aperture of the computing device enclosure when the bracket is coupled to the computing device enclosure. In these examples, the bracket can include a first portion positioned at a first level positioned to be proximate to a processor back-plate coupled to a printed circuit, and a second portion positioned at a second level above the first level, wherein the second portion is positioned to be proximate to the printed circuit on a first side and a coupling location for a heat sink on a second side.

In some examples, the present disclosure can include a system that includes a computing device chassis, a mounting location to couple a printed circuit to the computing device chassis, an access aperture to expose a processor back plate coupled to the printed circuit, and a bracket. In these examples, the bracket can include a locking mechanism to removably couple the bracket to the computing device chassis to cover the access aperture, a non-punch area positioned to be proximate to the processor back-plate when the bracket is coupled to the computing device chassis, and a punch area positioned to be proximate to the printed circuit. In some examples, a ridge is positioned between the punch area and the non-punch area to prevent heat transfer between the punch area and the non-punch area.

FIG. 1 illustrates an example of a device 100 for a processor backplate. FIG. 1 illustrates a first side 101-1 of a device 100 and a second side 101-2 of the device 100. As described herein, the device 100 can be a bracket that can be coupled to an enclosure bracket of a computing device enclosure to cover an aperture of the enclosure bracket, protect computing components exposed by the aperture, and/or remove heat generated by computing components.

In some examples, the first side 101-1 of the device 100 can illustrate a side to be positioned proximate or toward an electrical circuit (e.g., PCB, PCA, etc.) and the second side 101-2 of the device 100 that can be positioned away from the electrical circuit. In some examples, the device 100 can include a tab 102 that can be utilized to interact with a portion of the computing device enclosure to secure the device 100 to a bracket or portion of the computing device enclosure. In some examples, the tab 102 can be positioned within a tab receiving portion of the computing device enclosure to allow the tab 102 to interact with a first side of the enclosure bracket while allowing locking mechanisms 104 to be coupled to a second side enclosure bracket.

For example, the tab 102 can be utilized to align the device 100 at a particular position such that screws or other types of devices can be utilized with the locking mechanism 104 to couple the device 100 to the enclosure bracket. Although the locking mechanism 104 is illustrated as apertures for screws to be positioned through the device 100, examples are not so limited. That is, other types of locking mechanisms can be utilized to semi-permanently or removably couple the device 100 to the enclosure bracket. As used herein, semi-permanently couple and/or removably couple can refer to a direct connection between two or more devices that is fixed together during operation while still removable during maintenance. In this way, the device 100 can be securely affixed to the enclosure bracket during operation of the computing device and also removable when a processor, processor back-plate, or other proximate computing component is altered or removed.

In some examples, the first side 101-1 of the device 100 can include a non-punch area 106-1. In some examples, the non-punch area 106-1 can be an area of the device 100 that can be proximate to a processor back-plate that is coupled to an electrical circuit (e.g., PCB, PCA, etc.), a coupling area for a processor back-plate, and/or an area of an electrical circuit that is proximate to a processor coupling location. As described herein, a processor can be coupled to a first side of an electrical circuit. In some examples, a second side of the electrical circuit can be proximate to the first side 101-1 of the device 100 when the device 100 is coupled to the enclosure bracket. In some examples, the non-punch area 106-1 can be at a first distance from the electrical circuit when the device is coupled to the enclosure bracket.

In some examples, the first distance from the electrical circuit can allow space for a processor back-plate to be coupled to the second side of the electrical circuit. As used herein, a processor back-plate is a device that can be coupled to an opposite side of an electrical circuit than the processor to remove heat from the processor through the electrical circuit. In some examples, the processor back-plate can include a heat transfer material (e.g., material that conducts heat, etc.) to remove heat from the processor from the opposite side of the electrical circuit.

In some examples, the first side 101-1 of the device 100 can include a first punch area 108-1 and a second punch area 110-1. As used herein, a punch area can refer to an area of the device that is punched or moved with force in a particular direction. As use herein, punching a material in a particular direction can refer to utilizing a force to move the material in the particular direction without puncturing the material. In this way, a raised or lowered portion can be distributed along a portion of the material of the device 100 such that the material remains as a single piece of material. In some examples, the first punch area 108-1 can be a raised portion from the non-punch area 106-1 on the first side 101-1 of the device 100. In this way, the first punch area 108-1 can be at a second distance from the electrical circuit when the device 100 is coupled to the enclosure bracket. In some examples, the second distance can be less than the first distance such that the first punch area 108-1 is relatively closer to the electrical circuit than the non-punch area 106-1.

In some examples, the first punch area 108-1 can correspond to an area of the electrical circuit proximate to computing components other than the processor. For example, a plurality of computing components can be coupled to the first side of the electrical circuit around the processor. In this example, the first punch area 108-1 can correspond to an area of the second side of the electrical circuit of the plurality of components coupled to the first side of the electrical circuit. In some examples, the first punch area 108-1 can be positioned on a first edge of the device 100. In this way, the first punch area 108-1 can be positioned on a first edge or side of the processor to remove heat from computing components that are positioned on the first edge of the processor. In some examples, the second distance can allow the first punch area 108-1 to be relatively closer to the electrical circuit since a back-plate or other type of cooling device may not be coupled to the second side of the electrical circuit. In this way, the first punch area 108-1 can be utilized interact with the second side of the electrical circuit to remove heat from the plurality of computing components coupled to the first side of the electrical circuit.

In some examples, the device 100 can include a second punch area 110-1. In some examples, the second punch area 110-1 can be a second raised portion from the non-punch area 106-1 in a similar way as the first punch area 108-1. That is, a punching operation can be performed on the non-punch area 106-1 to alter the second punch area 110-1 to raised position on the first side 101-1 of the device 100. In some examples the second punch area 110-1 can be positioned on a second edge of the device 100. In some examples, the second punch area 110-1 can be positioned on the device 100 such that the second punch area 110-1 is proximate to a portion of the second side of the electrical circuit that is utilized to couple computing components on the first side of the electrical circuit. As described herein, a back-plate or cooling device may not be coupled to the second side of the electrical circuit for computing components other than the processor on the first side of the electrical circuit. In this way, the second punch area 110-1 can be positioned at the second distance or same distance as the first punch area 108-1 from the second side of the electrical circuit. In this way, the first punch area 108-1 and the second punch area 110-1 can be utilized to remove heat from computing components other than the processor through the electrical circuit.

In some examples, the first side 101-1 can include a ridge area 112-1. As used herein, a ridge area 112-1 can include an area of transition between a first level and a second level of the device 100. For example, the ridge area 112-1 can be a transition area between a level or height of the non-punch area 106-1 and a level or height of the first punch area 108-1 and/or second punch area 110-1. In some examples, the ridge area 112-1 can be generated when the first punch area 108-1 and/or second punch area 110-1 are generated by a punch operation.

In some examples, the ridge area 112-1 can create a thermal barrier between the non-punch area 106-1 and the first punch area 108-1. In a similar way, the ridge area 112-1 can create a thermal barrier between the non-punch area 106-1 and the second punch area 110-1. In some examples, the thermal barrier between the non-punch area 106-1 and the first punch area 108-1 and/or second punch area 110-1 can prevent heat removed through the first punch area 108-1 and/or second punch area 110-1 from moving toward the non-punch area 106-1. In this way, additional heat may be prevented from moving toward an area that is proximate to the processor coupled to the electrical circuit.

In some examples, a thermal gap filler can be positioned on a surface of the first punch area 108-1 and/or the second punch area 110-1. As used herein, a thermal gap filler can refer to a thermal interface material that can conduct heat away from heat generating devices. In some examples, the thermal gap filler can be utilized to transfer heat from the second side of the electrical circuit to the surface of the first punch area 108-1 and/or second punch area 110-1. In some examples, the thermal gap filler can be positioned to make physical contact with a surface of the first punch area 108-1 and a corresponding area of the second side of the electrical circuit. In a similar way, the thermal gap filler can be positioned to make physical contact with a surface of the second punch area 110-1 and a corresponding area of the second side of the electrical circuit. In these examples, the direct contact with the second side of the electrical circuit and corresponding punch area (e.g., first punch area 108-1, second punch area 110-1, etc.) can increase heat transfer between the electrical circuit and the device 100.

In some examples, the second side 101-2 of the device 100 can illustrate a side of the device 100 that can be directed away from the electrical circuit through the aperture of the enclosure bracket. In some examples, the second side 101-2 of the device 100 illustrate the non-punch area 106-2, first punch area 108-2, and the second punch area 110-2. As described herein, the first punch area 108-2 and the second punch area 110-2 can be depressed utilizing force to move the first punch area 108-2 and/or second punch area 110-2 away from a level of the non-punch area 106-2. As illustrated by the second side 101-2 of the device 100, the first punch area 108-2 can be at a lower level than the level of the non-punch area 106-2. In a similar way, the second punch area 110-2 can be at a lower level than the level of the non-punch area 106-2.

In some examples, the non-punch area 106-2 can be separated from the first punch area 108-2 by a ridge area 112-2. As described herein, the ridge area 112-2 can be generated when the first punch area 108-2 is generated by a punch process. In some examples, the second punch area 110-2 can include a similar ridge area to ridge area 112-2. In some examples, the first punch area 108-2 can be separated from the second punch area 110-2 by a portion of the non-punch area 106-2. In other examples, the first punch area 108-2 and the second punch area 110-2 can be connected without a separation of non-punch area 106-2.

In some examples, the first punch area 108-2 and the second punch area 110-2 of the second side 101-2 of the device 100 can include a coupling location for a heat sink or heat transfer device. As used herein, a heat sink can refer to a device or substance for absorbing heat. In some examples, the heat sink can be made of a conductive material that is capable of transferring heat from a first location to a second location. In some examples, the heat sink can be a passive heat sink and/or an active heat sink. As used herein, a passive heat sink can include a device that can disperse heat away from a heat generating device through a structure of the heat sink (e.g., fins, etc.) that can interact with surrounding area.

As used herein, an active heat sink can include mechanical devices to transfer heat from a first location to a second location. For example, the mechanical devices can include liquid pumps, fans, or other mechanical devices for transferring heat. As used herein, a coupling location for a heat sink can include a surface that can be utilized to couple a heat sink within the first punch area 108-2 and/or the second punch area 110-2. In some examples, a heat sink can be utilized to increase the heat transfer through the electrical circuit and away from the non-punch area 106-2.

Figure 2:
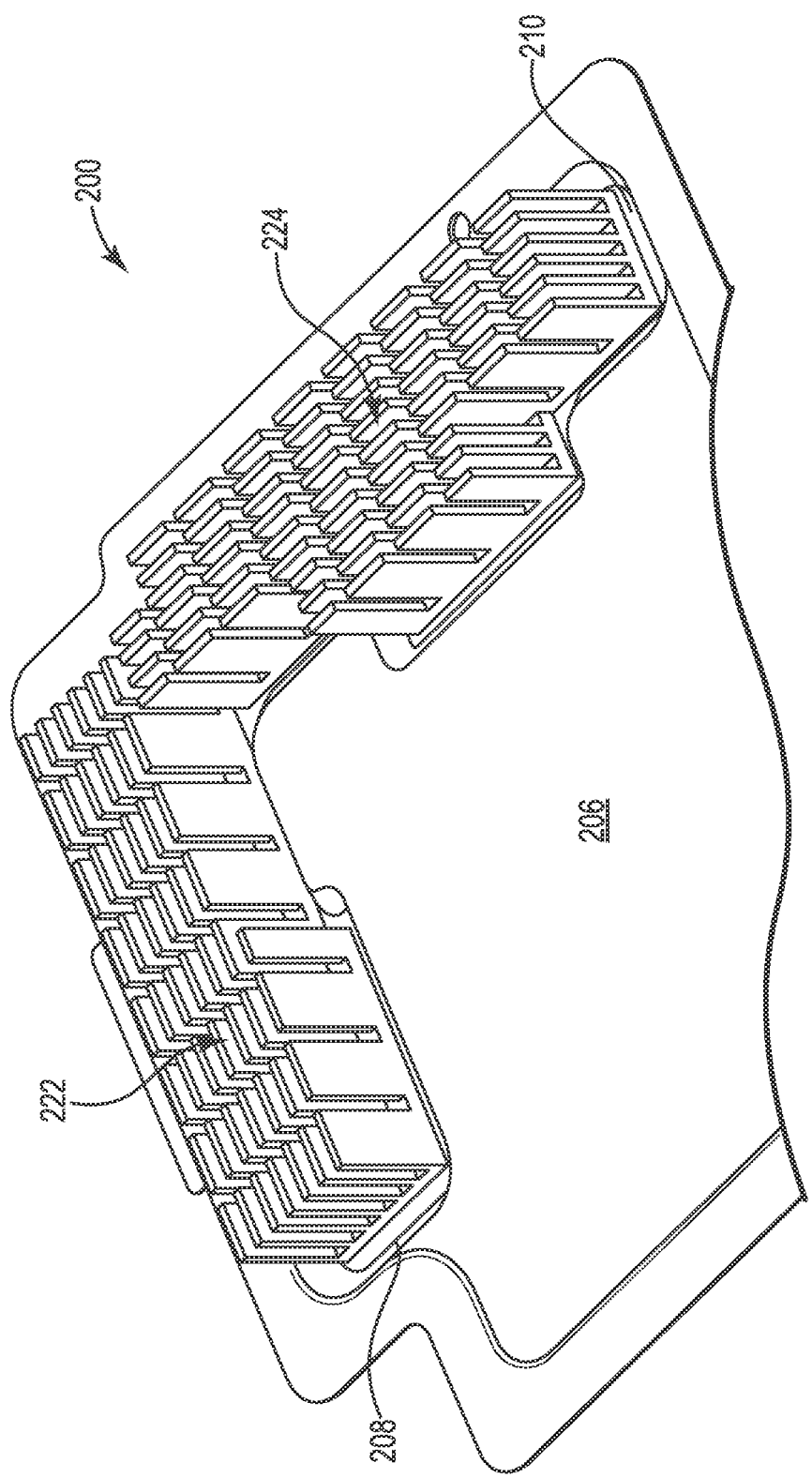
FIG. 2 illustrates an example of a device for a processor back-plate that includes heat sinks.

FIG. 2 illustrates an example of a device 200 for a processor back-plate that includes heat sinks 222, 224. FIG. 2 illustrates a second side of the device 200 as referenced by the second side 101-2 as illustrated in FIG. 1. As described herein, the device 200 can include a non-punch area 206 that can be positioned at a first level, a first punch area 208 that can be positioned at a second level, and a second punch area 210 that can be positioned at the second level or a third level. As illustrated in FIG. 2, the first punch area 208 and the second punch area 210 can be poisoned at a lower level than the non-punch area 206. In some examples, the lower level than the non-punch area 206 can be a cavity to couple a corresponding heat sink positioned in a direction opposite to an electrical circuit when the device 200 is coupled to an enclosure bracket.

In some examples, the first punch area 208 and/or the second punch area 210 can include a coupling mechanism to couple a heat sink (e.g., first heat sink 222, second heat sink 224, etc.) within the area. In some examples, a first heat sink 222 can be positioned within the first punch area 208 and the second heat sink 224 can be positioned within the second punch area 210. In some examples, the first heat sink 222 can be separate and distinct from the second heat sink 224. In other examples, the first heat sink 222 can be connected to the second heat sink 224.

As illustrated in FIG. 2, the first heat sink 222 and the second heat sink 224 can be passive finned heat sinks that include a plurality of finned structures to help dissipate heat away from the surface of the device 200. In some examples, the first heat sink 222 and the second heat sink 224 can be utilized to direct heat away from the surface of the first punch area 208 and/or second punch area 210 such that less heat is transferred toward the non-punch area 206. As described herein, the non-punch area 206 can be positioned proximate to a location for coupling a processor to an opposite side of an electrical circuit. Heat that is transferred from the first punch area 208 and/or the second punch area 210 toward the non-punch area could increase heat in the proximity of the processor.

Figure 3:
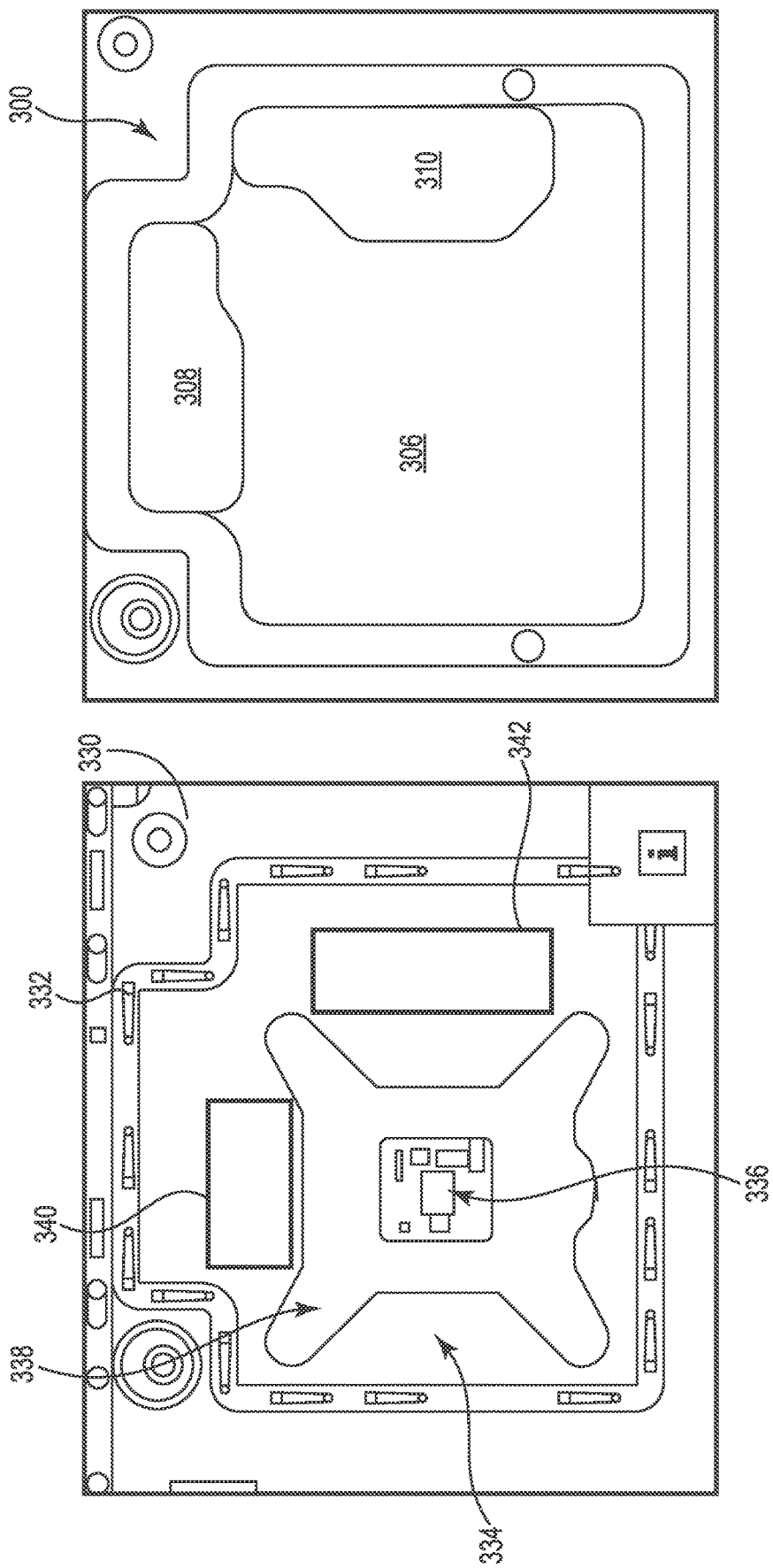
FIG. 3 illustrates an example of a bracket aperture and device for a processor back-plate.

FIG. 3 illustrates an example of a bracket aperture 332 and device 300 for a processor back-plate 338. FIG. 3 illustrates an enclosure bracket 330 that includes a bracket aperture 332. In some examples, the enclosure bracket 330 can include a mounting structure within a computing device enclosure. In some examples, the enclosure bracket 330 can be utilized to couple an electrical circuit 334 so as to fix the electrical circuit 334 at a particular location within the computing device enclosure.

As described herein, the electrical circuit 334 can be a PCB, PCA, or other type of mechanical support for a computing device. In some examples, the electrical circuit 334 can be utilized to couple a processor 336 and/or other computing components. For example, the electrical circuit 334 can be a motherboard of the computing device that includes a central processing unit (CPU) of a computing device. FIG. 3 illustrates a second side of the electrical circuit 334 and the processor 336 can be coupled to a first side of the electrical circuit 334 that is opposite to the second side. In some examples, a processor back-plate 338 can be coupled to the second side of the electrical circuit 334. In some examples, the processor back-plate 338 can be utilized to transfer heat generated by the processor 336 toward the second side of the electrical circuit 334. In some examples, the processor back-plate 338 can be raised above a surface of the electrical circuit 334 to remove heat from a surface of the electrical circuit 334.

In some example, the device 300 can be utilized to cover the enclosure aperture 332. In this way, the aperture 332 can provide access to the processor 336 and/or processor back-plate 338 during maintenance and the device 300 can be utilized to protect the electrical circuit 334 and/or processor back-plate 338 during operation of the computing device.

In some examples, the device 300 can include a non-punch area 306 that can be positioned over an area of the electrical circuit 334 that includes the processor 336 and/or processor back-plate 338. As described herein, the processor back-plate 338 can protrude from a surface of the electrical circuit 334. In this way, the non-punch area 306 can be positioned at a greater distance from the electrical circuit 334 than the first punch area 308 and/or the second punch area 310 to accommodate the protrusion of the processor back-plate 338.

In some examples, the first punch area 308 can correspond to a first area 340 of the electrical circuit 334. In some examples, the first area 340 of the electrical circuit 334 can be an area that is utilized to couple computing components other than the processor 336. For example, a plurality of voltage regulators (e.g., voltage regulator module, processor power module, etc.) can be coupled to a first side of the electrical circuit 334 within the first area 340. In a similar way, the second punch area 310 can correspond to a second area 342 of the electrical circuit 334. In some examples, the second area 342 of the electrical circuit 334 can be an area that is utilized to couple computing components other than the processor 336. For example, a plurality of voltage regulators can be coupled to a first side of the electrical circuit 334 within the second area 342. As used herein, a voltage regulator and/or voltage regulator module can refer to a buck converter that can provide a processor a particular supply voltage.

Figure 4:
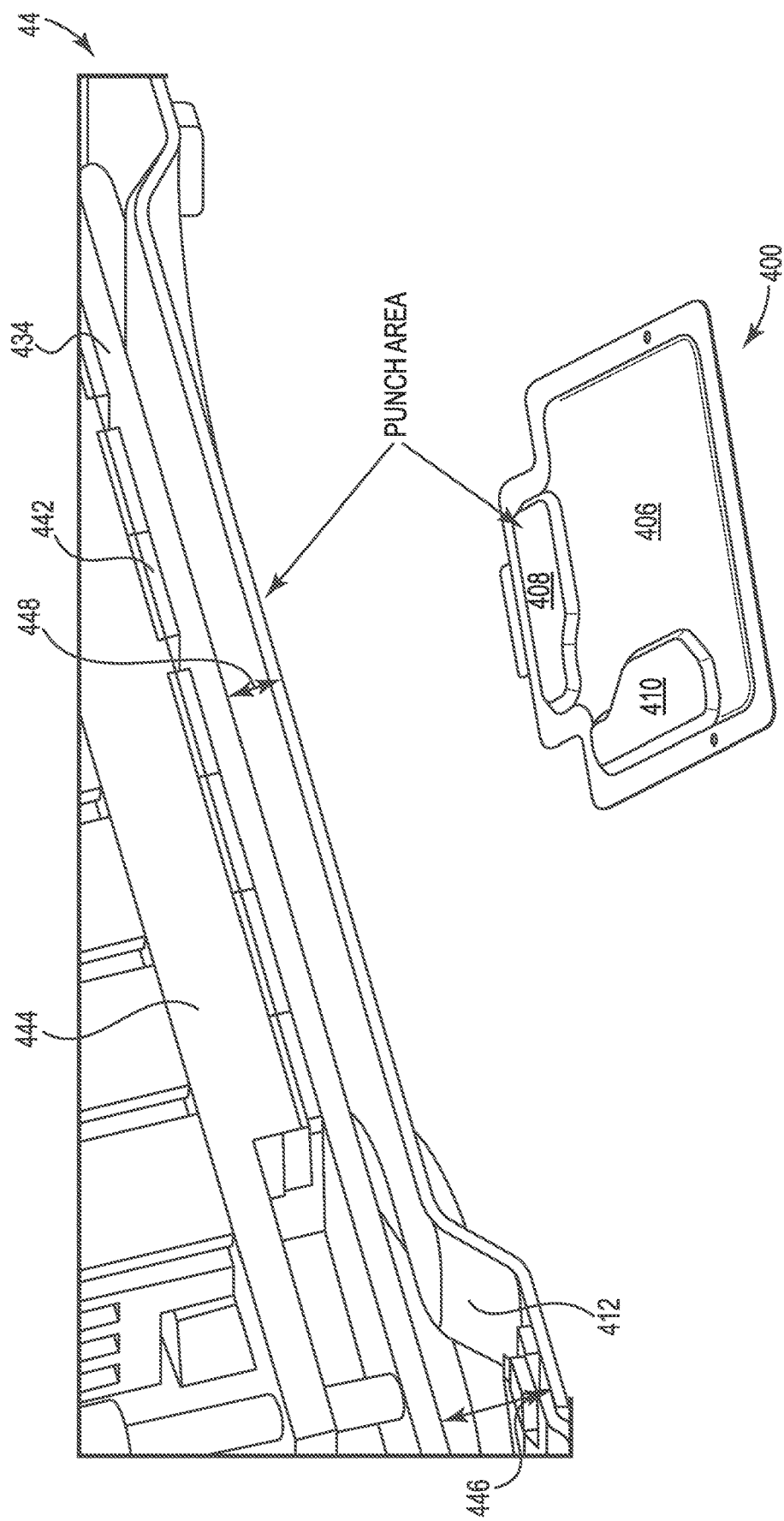
FIG. 4 illustrates an example of a system that includes a device for covering a processor back-plate.

FIG. 4 illustrates an example of a system 440 that includes a device 400 for a covering a processor back-plate. As described herein, the device 400 can include a cover or bracket portion that can be utilized to cover an aperture of an enclosure bracket that can provide access to the processor back-plate. FIG. 4 illustrates the features of the device 400 as well as a close-up of the first punch area 408 when the device 400 is coupled to the enclosure bracket.

As described herein, the device 400 can include a non-punch area 406, a first punch area 408, and a second punch area 410. In some examples, the device 400 can include a ridge area 412 between the non-punch area 406 and the first punch area 408 and/or second punch area 410. In some examples, the ridge area 412 can position the first punch area 408 and/or second punch area 410 closer to an electrical circuit 434 compared to the non-punch area 406. As described herein, the first punch area 408 and/or second punch area 410 can be positioned at an area of the device 400 that corresponds to electrical components 442 coupled to a location of electrical components 442 coupled to the electrical circuit 434 when the device 400 is coupled to the enclosure bracket. In this way, the first punch area 408 and/or second punch area 410 can be utilized to remove heat generated by the electrical components 442 during operation of the computing device. In some examples, the electrical components 442 can be voltage regulators or other components that generate heat while the computing device is operating.

In some examples, the electrical components 442 can be in contact with a heat sink 444 coupled to a first side of the electrical circuit 434. In some examples, the heat sink 444 can be utilized to remove heat from the first side of the electrical circuit 434 generated by the electrical components 442. In this way, heat can be removed by the heat sink 444 away from the first side of the electrical circuit 434 and the first punch area 408 and/or second punch area 410 can be utilized to remove heat from the second side of the electrical circuit 434.

As described herein, the non-punch area 406 can be a first distance 446 from the electrical circuit 434 and the first punch area 408 and/or second punch area 410 can be a second distance 448 from the electrical circuit 434. In some examples, the first distance 446 can be greater than the second distance 448. In this way, the non-punch area 406 can accommodate the processor back-plate coupled to a second side of the electrical circuit 434. As described herein, the ridge area 412 can alter the device 400 from the first distance 446 to the second distance 448. In some examples, the first punch area 408 and/or second punch area 410 can protrude beyond a surface of a processor back-plate that is within the first distance 446 of the non-punch area 406. That is, the height of the processor back-plate can extend further than the second distance 448. In this way, the non-punch area 406 with a first distance 446 can be a similar distance from the processor back-plate as the first punch area 408 and/or second punch area 410 is from the electrical circuit 434.

As described herein, the device 400 can be coupled to the enclosure bracket to protect the electrical circuit 434 and/or electrical components 442 during operation. In some examples, the device 400 can be removably coupled to the enclosure bracket to allow access to the electrical circuit 434 through an aperture of the enclosure bracket.

In the foregoing detailed description of the disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the disclosure. Further, as used herein, "a" refers to one such thing or more than one such thing.

The figures herein follow a numbering convention in which the first digit corresponds to the drawing figure number and the remaining digits identify an element or component in the drawing. For example, reference numeral 102 may refer to element 102 in FIG. 1 and an analogous element may be identified by reference numeral 302 in FIG. 3. Elements shown in the various figures herein can be added, exchanged, and/or eliminated to provide additional examples of the disclosure. In addition, the proportion and the relative scale of the elements provided in the figures are intended to illustrate the examples of the disclosure, and should not be taken in a limiting sense.

It can be understood that when an element is referred to as being "on," "connected to", "coupled to", or "coupled with" another element, it can be directly on, connected, or coupled with the other element or intervening elements may be present. In contrast, when an object is "directly coupled to" or "directly coupled with" another element it is understood that are no intervening elements (adhesives, screws, other elements) etc.

The above specification, examples, and data provide a description of the system and method of the disclosure. Since many examples can be made without departing from the spirit and scope of the system and method of the disclosure, this specification merely sets forth some of the many possible example configurations and implementations.

What is claimed is:

1. A device, comprising:
    a locking mechanism to couple the device to a computing device enclosure;
    a first portion at a first level to interact with a processor back-plate; and
    a second portion at a second level to interact with an area proximate to the processor back-plate, wherein the second portion protrudes to the second level toward the processor back-plate when the device is coupled to the computing device enclosure and is to receive a heat sink.

2. The device of claim 1, wherein the processor back-plate is coupled to a first side of an electrical circuit and a processor is coupled to a second side of the electrical circuit that is opposite of the first side.

3. The device of claim 2, wherein the second portion protrudes to the second level beyond a surface of the processor back-plate.

4. The device of claim 1, wherein the second portion includes a coupling mechanism to couple the heat sink within the area of the second portion.

5. The device of claim 1, wherein the second portion is positioned at a location of a printed circuit that is opposite to a computing component coupled to the printed circuit.

6. The device of claim 5, wherein the computing component is a voltage regulator module for a processor resource.

7. The device of claim 1, wherein the second portion includes a thermal gap filler positioned between the second portion and a surface of an electrical circuit.

8. The device of claim 1, wherein the second portion includes a first punch area and a second punch area.

9. The device of claim 1, wherein the processor back-plate is coupled to a first side of an electrical circuit and the second portion protrudes to the second level to interact with the first side of the electrical circuit.

10. The device of claim 1, wherein the second portion is a punch area that creates a ridge between the first portion and the second portion, wherein the ridge provides a thermal barrier between the first portion and the second portion.

11. A bracket, comprising:
    a locking mechanism to couple and decouple the bracket to a computing device enclosure, wherein the bracket covers an aperture of the computing device enclosure when the bracket is coupled to the computing device enclosure;
    a first portion positioned at a first level positioned to be proximate to a processor back-plate coupled to a printed circuit; and
    a second portion positioned at a second level above the first level, wherein the second portion is positioned to be proximate to the printed circuit on a first side and a coupling location for a heat sink on a second side, wherein the heat sink is to extend from the second portion towards the first portion.

12. The bracket of claim 11, wherein a thermal gap filler is positioned between the printed circuit and the first side of the second portion.

13. The bracket of claim 11, wherein the second portion is positioned proximate to the printed circuit to remove heat generated by computing components coupled to an opposite side of the printed circuit away from the first portion.

14. The bracket of claim 11, wherein the second portion is a punch area to provide a ridge between the first portion and the second portion.

15. A system, comprising:
    a computing device chassis;
    a mounting location to couple a printed circuit to the computing device chassis;
    an access aperture to expose a processor back-plate coupled to the printed circuit; and
    a bracket, comprising:
        a locking mechanism to removably couple the bracket to the computing device chassis to cover the access aperture;
        a non-punch area positioned to be proximate to the processor back-plate when the bracket is coupled to the computing device chassis; and
        a punch area positioned to be proximate to the printed circuit, wherein a ridge is positioned between the punch area and the non-punch area to prevent heat transfer between the punch area and the non-punch area.

16. The system of claim 15, comprising a thermal gap filler coupled to the punch area and the printed circuit.

17. The system of claim 15, wherein the punch area includes a cavity to couple a plurality of heat sinks positioned in a direction opposite to the printed circuit.

18. The system of claim 15, wherein the processor back-plate is a thermal device to remove heat from a processor positioned on an opposite side of the printed circuit.

* * * * *